(12) United States Patent
Pelley et al.

(10) Patent No.: US 8,947,970 B2
(45) Date of Patent: Feb. 3, 2015

(54) WORD LINE DRIVER CIRCUITS AND METHODS FOR SRAM BIT CELL WITH REDUCED BIT LINE PRE-CHARGE VOLTAGE

(75) Inventors: Perry H. Pelley, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 196 days.

(21) Appl. No.: 13/548,846

(22) Filed: Jul. 13, 2012

(65) Prior Publication Data

US 2014/0016400 A1     Jan. 16, 2014

(51) Int. Cl.
*G11C 11/413*     (2006.01)
*G11C 8/08*     (2006.01)
*G11C 11/418*     (2006.01)

(52) U.S. Cl.
CPC ............. *G11C 8/08* (2013.01); *G11C 11/418* (2013.01)
USPC ...................................... 365/230.06; 365/154

(58) Field of Classification Search
CPC .............. G11C 8/08; G11C 8/10; G11C 8/12; G11C 11/4085; G11C 11/413
USPC ............................................. 365/154, 230.06
See application file for complete search history.

(56) References Cited

U.S. PATENT DOCUMENTS

| | | | |
|---|---|---|---|
| 6,580,658 B1 | 6/2003 | Hsu et al. | |
| 6,826,074 B2 * | 11/2004 | Yamauchi | 365/154 |
| 7,027,351 B2 | 4/2006 | Lee et al. | |
| 7,187,205 B2 | 3/2007 | Ramaraju et al. | |
| 7,242,634 B2 | 7/2007 | Fenstermaker et al. | |
| 7,554,876 B2 | 6/2009 | Kim | |
| 7,719,920 B2 * | 5/2010 | Anvar et al. | 365/233.1 |
| 7,764,535 B2 | 7/2010 | Nguyen | |

* cited by examiner

*Primary Examiner* — Hoai V Ho
*Assistant Examiner* — Tri Hoang (57) ABSTRACT

A memory device comprising a plurality of static random access memory (SRAM) bit cells, and a word line driver coupled to provide a word line signal to the bit cells. The word line driver receives a global word line signal that remains active while the word line signal is asserted and subsequently de-asserted, and the word line signal is coupled between a positive supply voltage (VDD) and a supply voltage below ground (VN).

19 Claims, 5 Drawing Sheets

WORD LINE DRIVER CIRCUITS AND METHODS FOR SRAM BIT CELL WITH REDUCED BIT LINE PRE-CHARGE VOLTAGE

BACKGROUND

1. Field

This disclosure relates generally to semiconductor memory devices, and more specifically, to static random access memory (SRAM) devices.

2. Related Art

Semiconductor memory devices are used in a wide variety of electronic devices such as portable telephones, digital cameras, mobile and stationary computing devices, automobiles, appliances, and other devices.

The key attributes of an SRAM memory are the speed and power of the memory. SRAM memory is often employed when high speed access is required. SRAM memory is a static memory that requires power to be maintained for data retention. However, data retention requires relatively little power. Much of the power dissipated in an SRAM memory relates to the bit lines charging and discharging. Another important aspect of an SRAM is the signal provided to the bit lines by a bit cell during a Read access, that is, how fast that signal is provided and how reliably that signal can be sensed. Another key attribute of an SRAM memory is the soft error rate, that is, the ability of the memory to retain data when exposed to high energy sub-atomic particles. Therefore there is a need for an SRAM memory bit cell that requires lower power, that is faster to provide a signal that can be sensed reliably and that has a lower soft error rate.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of SRAM memory devices are disclosed that include six transistor (6T) bit cells with bit lines pre-charged to ½ VDD and low VT pass transistors. The bit cells use 50% lower power during read and write operations since the bit lines swing ½ of the supply voltage (VDD) instead of full VDD. Additionally, the bit cells have faster write and pre-charge speeds since bit lines only slew ½ VDD. Bit lines driven with ½ VDD allow faster sensing since the cross coupled p-transistors as well as the cross coupled n transistors of a dynamic sense amplifier can be employed to provide gain. Use of ½ VDD instead of full VDD also reduces power supply noise due to less crowbar current as sensing resolves more quickly. The area required to implement the ½ VDD bit cells in a highly scaled technology is comparable to other 6T bit cells. The ½ VDD bit cells have similar or improved stability as other 6T bit cells. Since more transistors are employed in reading data from the bit cell to create a signal on the bit lines and more transistors are employed in sensing the bit line signal, there is a reduced chance of a defect in any of those transistors being fatal to the operation of the SRAM, resulting in a higher memory yield. Further the transistor sizes associated with the bit cell with ½ VDD bit lines provide a higher immunity to soft errors.

Figure 1:
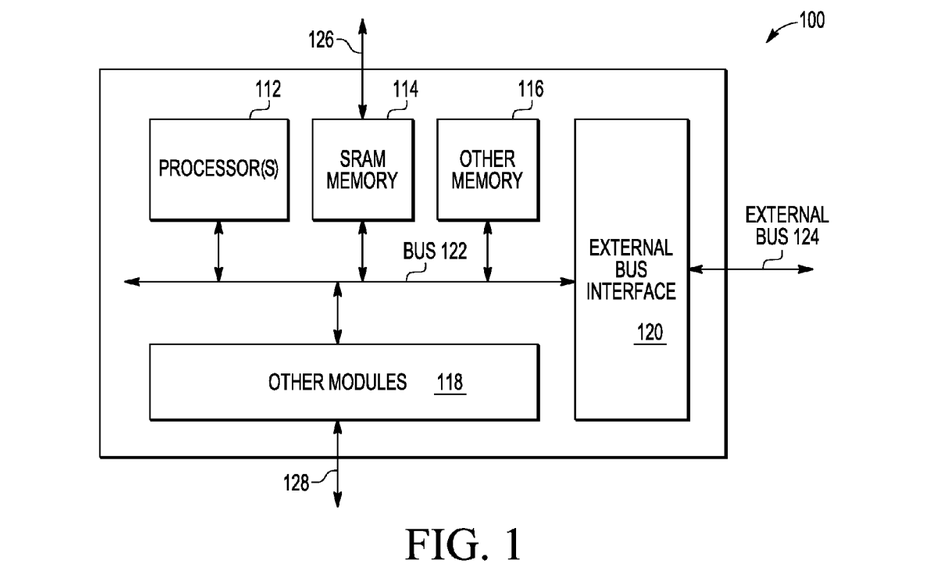
FIG. 1 illustrates a block diagram of an embodiment of a processing system in accordance with the present invention.

FIG. 1 illustrates a block diagram of an embodiment of a processing system 100 in accordance with the present invention that can include one or more processors 112, one or more SRAM memories 114, one or more other memories 116, one or more other modules 118, and an external bus interface 120 which may be bi-directionally coupled by way of bus 122. External bus interface 120 can be coupled to an external bus 124 which may be used to communicate information to and from system 100. SRAM memory 114 can be coupled to one or more integrated circuit terminals 126 which may be used to communicate information between SRAM memory 114 and circuitry (not shown) that is external to system 100. In alternate embodiments, computer processor(s) 112, other memory(s) 116, and other module(s) 118 may have one or more integrated circuit terminals (not shown) which may be used to communicate information to and/or from circuitry (not shown) that is external to system 100.

An embodiment of SRAM memory 114 includes an array of bit cells that may be Write accessed to store data and Read accessed to retrieve the stored data.

Figure 2:
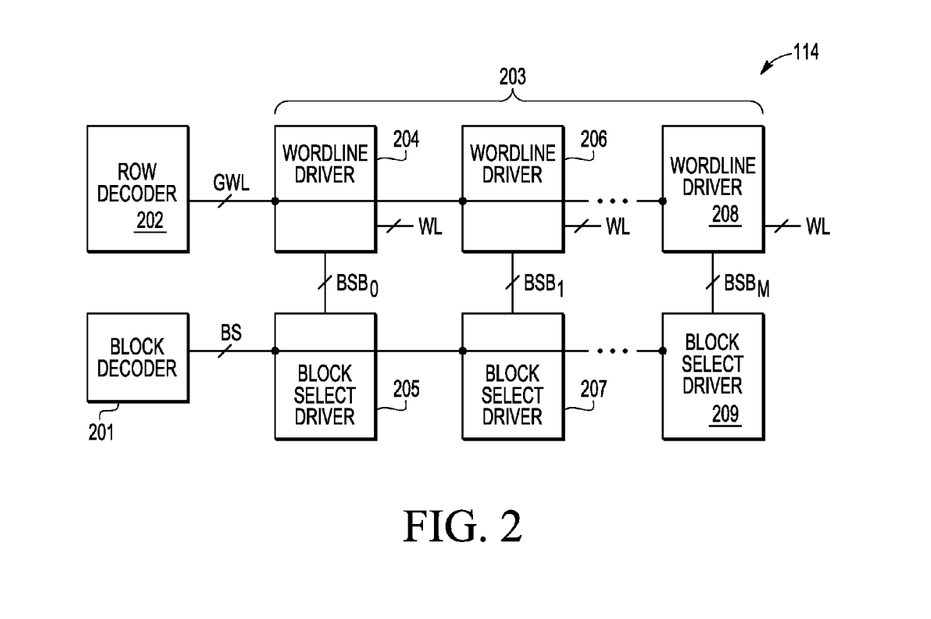
FIG. 2 illustrates a block diagram of components that can be included in SRAM memory of FIG. 1 in accordance with the present invention.

FIG. 2 illustrates a block diagram of components that can be included in SRAM memory 114 of FIG. 1 in accordance with the present invention including block decoder 201, row decoder 202, and memory array 203. Row decoder 202 provides global word line signals GWL to word line drivers 204, 206, 208. A selected one of the global word line signals provided is asserted. Block decoder 201 provides block select signals BS to block select drivers 205, 207, 209. The block select signal BS selects one of the block select drivers 205, 207, 209, which provides a block select bar signal BSB to its corresponding word line driver 204, 206, 208, for selecting and deselecting that word line driver. The selected word line driver selects a word line corresponding to the asserted GWL signal. The selected word line selects a plurality of bit cells coupled to that word line.

Figure 3:
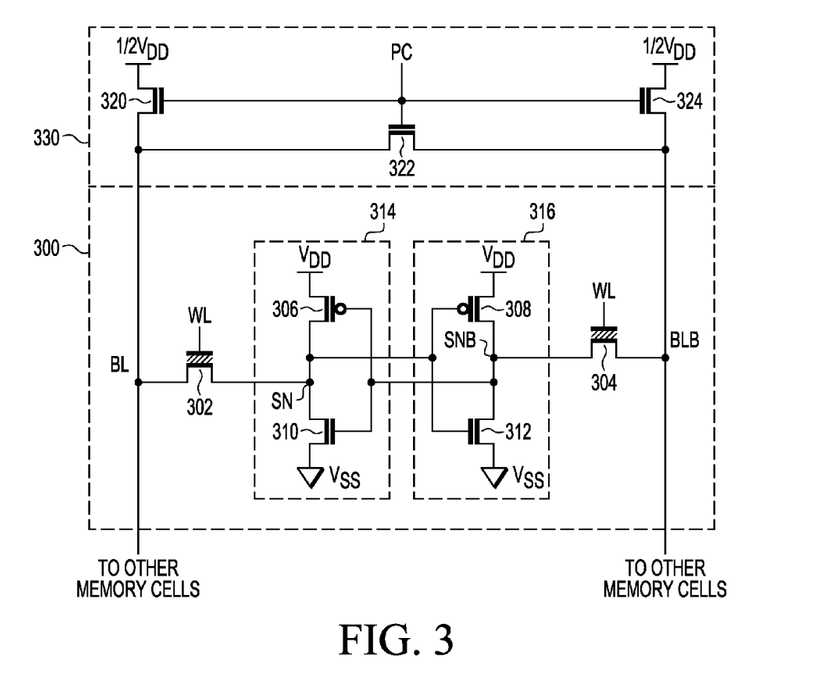
FIG. 3 illustrates a circuit diagram of a bit cell that can be included in SRAM memory of FIG. 2.

FIG. 3 illustrates a circuit diagram of bit cell 300 coupled to bit line BL, complementary bit line BLB, and pre-charge circuit 330 that are included in SRAM memory array 203 of memory 114 of FIGS. 1 and 2. Memory cell 300 comprises pass transistors 302, 304, pull-up PMOS transistors 306, 308, and pull-down NMOS transistors 310, 312. Pass transistors 302, 304 are low threshold voltage (VT) MOSFETS with a substantially lower VT than pull down transistors 310 and 312. Due to the low VT of pass transistors 302, 304, negative voltage applied to the gates of pass transistors 302, 304 is required to shut off current flow through pass transistors 302, 304.

PMOS transistor 306 and NMOS transistor 310 are coupled as a first inverter 314 with the source of PMOS transistor 306 coupled to supply voltage VDD and the source of NMOS transistor 310 coupled to ground VSS. The gates of transistors 306 and 310 are coupled to the input of inverter 314 and the drains of transistors 306 and 310 are coupled to the output of inverter 314. PMOS transistor 308 and NMOS transistor 312 are coupled as a second inverter 316 with the source of PMOS transistor 308 coupled to supply voltage VDD and the source of NMOS transistor 312 coupled to ground VSS. The gates of transistors 308 and 312 are coupled to the input of inverter 316 and the drains of transistors 308 and 312 are coupled to the output of inverter 316. The inputs and outputs of inverters 314, 316 are cross-coupled to one another and to the first current electrodes of low VT pass transistors 302, 304 at respective sense nodes SN and SNB. A bit line signal BL is coupled to the second current electrode of pass transistor 302 and a complementary bit line signal BLB is coupled to the second current electrode of pass transistor 304. Word line signals WL are coupled to the control gates of pass transistors 302, 304.

With a conventional 6-T bit cell with bit lines pre-charged to VDD, one of the bit lines must be switched for a power consumption that is a function of capacitance times the square of voltage ($CV^2$). With the of bit cell 300 with bit lines being pre-charged to ½ VDD, writing requires each of the bit lines to switch ½ VDD, one bit line to VDD and one bit line to VSS. Since each bit line of the bit cell 300 must switch only ½ VDD, the power is a function of $2*C*(½V)^2 = 2*¼*CV^2 = ½ CV^2$, or one-half the power of the conventional cell. The data nodes SN and SNB store the data written to bit cell 300 across inverters 314 and 316. When a logic '1' is written to bit cell 300, the node SN will be a logic '1' or VDD and the node SNB will be a logic '0' or VSS. When a logic '0' is written to bit cell 300 the node SN will be a logic '0' or VSS and the node SNB will be a logic '1' or VDD.

Pre-charge circuit 330 comprises transistors 320, 322, and 324. The sources of transistors 320 and 324 are coupled to ½ VDD and the drains of transistors 320 and 324 are coupled to bit line signals BL and BLB respectively. The current carrying electrodes of transistor 322 are coupled to BL and BLB. The gates of transistors 320, 322 and 324 are coupled to a pre-charge signal PC. During pre-charge for either a Read or Write access, the bit lines are shorted together by transistor 322, returning both bit lines to ½ VDD. Transistors 320 and 324 keep the ½ VDD level from drifting over time. Since the bit lines are shorted together, there is no power supply current surge during pre-charge and pre-charge can be switched much faster than with a conventional 6-T bit cell that has a current surge on VDD during pre-charge.

With standard 6-T SRAM bit device sizes, the low threshold voltage VT associated with low VT pass transistors 302, 304 would improve write performance of bit cell 300 but would correspondingly degrade read performance due to a low signal noise margin associated with the low threshold voltage and small pull-up PMOS transistors 306, 308. To help offset the low signal noise margin, the drive strength or transconductance of PMOS transistors 306, 308 is selected to be approximately the same as the drive strength or transconductance of NMOS transistors 310, 312. PMOS transistors 306, 308 with approximately the same transconductance as NMOS transistors 310, 312 helps improve the stability or static noise margin of bit cell 300 given the low static margin associated with low threshold voltage for pass transistors 302, 304 while providing sufficient write margin. Additionally, the relatively strong P-transistors 306, 308 provide a strong current to counter soft error events, which attempt to destroy the '1' level of the bit cell 300.

The low VT pass transistors 302, 304 along with the matching transconductance of the pull up transistors 306, 308 and the pull down transistors 310, 312, are sufficient to provide stability with the bit lines pre-charged to approximately ½ VDD. When the word line of bit cell 300 is selected with lines pre-charged to approximately ½ VDD, one of the pass transistors 302 or 304 will pull up on BL or BLB respectively, depending on the data stored on the nodes SN and SNB of memory cell 300. The other pass transistor 302 or 304 will pull down on BL or BLB respectively. Unlike a conventional 6-T SRAM bit cell which can only pull down, both sides of the bit cell 300 are active. During a Read access, the pass transistor 302 or 304 coupled to corresponding node SN or SNB with a stored '1' will pull up on the corresponding bit line BL or BLB, while the other pass transistor 302 or 304 coupled to the corresponding node SN or SNB with a stored '0' will pull down on its corresponding bit line. Since both sides of the bit cell 300 provide current to develop signal on the bit line, the bit cell is less sensitive to defects in any transistor of the bit cell 300, allowing memory 114 to have higher yield. In a similar way the sense amplifier (not shown) associated with bit lines BL and BLB will both pull up and pull down to amplify the differential signal on BL and BLB, which allows faster sensing and higher resistance to defects.

Figure 4:
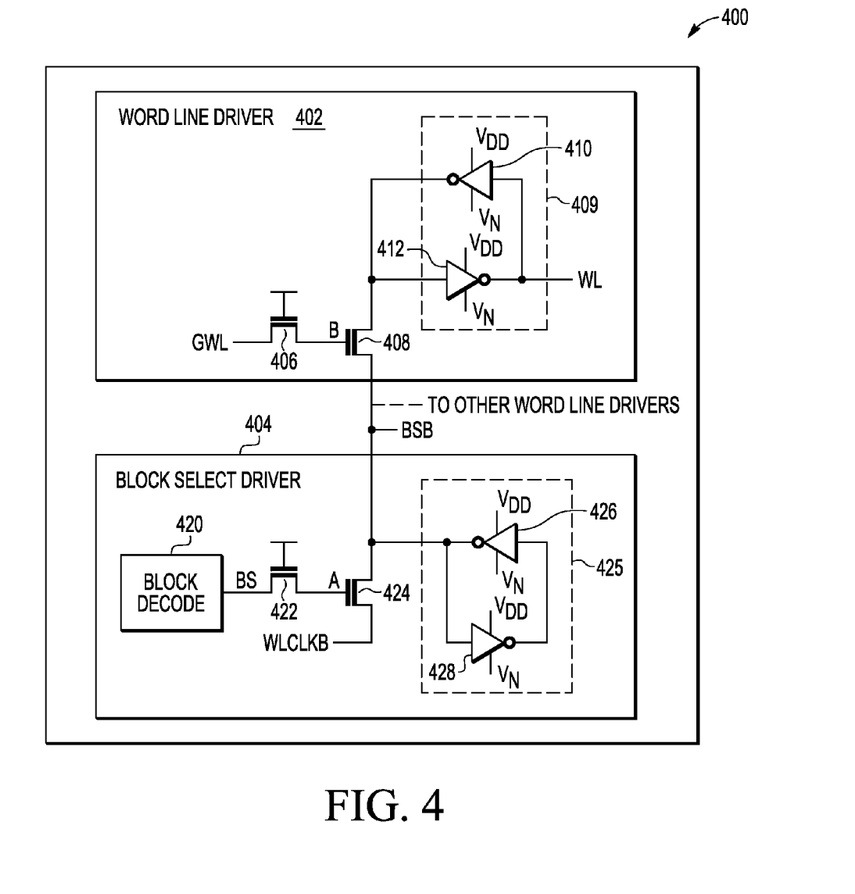
FIG. 4 illustrates a circuit diagram of an embodiment of a word line driver circuit that can be included in SRAM memory of FIG. 2.

FIG. 4 illustrates a circuit diagram of a word line driver circuit 400 including word line driver 402 and block select driver 404 that can be included in SRAM memory 114 as respective word line drivers 204, 206, 208 and block select drivers 205, 207, 209 of FIG. 2. Word line driver 402 includes a first pass transistor 406, a second pass transistor 408, and latch circuit 409. Pass transistor 406 with a gate electrode coupled to VDD conducts a global word line signal GWL to a control gate terminal of pass transistor 408. The GWL signal varies between the supply voltage VDD and ground VSS. When the GWL signal is active high, pass transistor 408 conducts a complementary block select BSB generated by block select driver 404 to latch circuit 409. Latch circuit 409 includes a drive inverter 412 and a feedback inverter 410. The inverters 410, 412 are coupled between VDD and a negative voltage VN that is lower or less than ground VSS such that output signal WL swings between VDD and VN. When GWL is active high and BSB is active low drive inverter 412 receives the active low BSB signal and outputs a word line signal WL that is provided to bit cells coupled to the word line, such as bit cell 300 in FIG. 3. Feedback inverter 410 receives the word line signal WL and provides a feedback signal to the input to drive inverter 412, latching the output signal word line signal WL.

Block select driver 404 includes a first pass transistor 422, a second pass transistor 424, and latch circuit 425. Pass transistor 422 with a gate coupled to VDD conducts a block select signal BS from block decoder 420 to a control gate terminal of pass transistor 424. When the block select signal BS is active high, pass transistor 424 conducts a complementary word line clock signal WLCLKB to latch circuit 425 and pass transistor 408 for word line driver circuit 402. The WLCLKB signal is driven between the supply voltage VDD and ground VSS. Latch circuit 425 includes two inverters 426 and 428 coupled between VDD and a negative voltage VN that is lower or less than ground VSS. Inverter 428 receives the WLCLKB signal and outputs an inverted WLCLKB that is provided to the input of inverter 426.

In some highly scaled technologies, the inverters 410, 412, 426 and 428 may require series cascode devices in series with the pull up and pull down devices to avoid breakdown resulting from the larger than normal voltage across these devices due to the VN supply. In some highly scaled technologies pass transistors 406, 422 may have VTs substantially lower than other n-channel transistors of word line driver 402 and block select driver 404. For example, in some embodiments, the threshold voltage VT of pass transistors 406, 422 is approximately 30 to 50 percent lower than the threshold voltage of NMOS transistors 408, 424 of word line driver 402 and block select driver 404. Other suitable threshold voltages can be used for pass transistors 406, 422, however.

Figure 5:
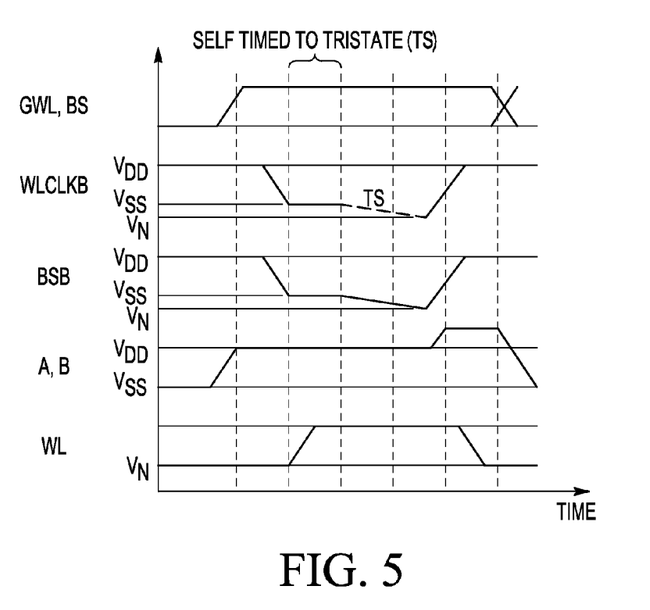
FIG. 5 illustrates an example of the waveforms for various signals used in the word line driver circuit of FIG. 4.

The operation of word line driver circuit 400 and block select driver 404 is now described with reference to FIG. 5, which illustrates an example of time waveforms for various signals used in the word line driver circuit 400 of FIG. 4. At the start a word line activation, the global word line GWL and block select BS signals are driven from ground VSS to the supply voltage VDD for the selected word line driver 402. The block select signal BS is coupled through pass gate transistor 422 to node A which is coupled to the gate of transistor 424. The global word line signal GWL is coupled through pass gate transistor 406 to the gate of pass transistor 408. After the global word line and block select signals reach VDD, the word line clock signal WLCLK is driven from the supply voltage VDD to ground VSS, which drives the complementary block select signal BSB from the supply voltage VDD to ground VSS. After the word line clock and complementary block select signals reach ground, the word line signal WL generated by latch circuit 409 is driven from a negative voltage VN to a positive voltage VDD.

The word line signal WL selects bit cell 300 and other bit cells on the word line signal WL allowing a differential signal to be coupled from bit cell 300 onto bit lines BL and BLB of bit cell 300, and in a similar way differential signals are coupled onto the associated bit lines of the other bit cells coupled to the word line signal WL. After the differential signals are developed on bit lines of the WL selected bit cells, the signals are each sensed by a corresponding sense amplifier (not shown). After the word line signal WL reaches the VDD voltage, the word line clock bar signal WLCLKB is tri-stated allowing the outputs inverters 410 and 428 to switch to negative voltage VN. The tristated word line clock bar signal WLCLKB follows the complementary block select signal BSB to the negative voltage VN. Once the signals on the bit lines of the selected bit cells including bit cell 300 are sensed with the global word line signal GWL remaining high, the word line clock signal WLCLK is driven back up to the supply voltage VDD. The parasitic capacitance between control gates and respective current electrodes in pass transistors 408, 424 self boosts nodes A and B at pass transistors 408, 424 to a voltage above VDD allowing a full VDD level to be coupled through pass transistors 408 and 424 to the signal BSB and the inputs to inverters 412 and 428 deselecting word line WL to the VN voltage. The VN voltage compensates for the lower VTs of the pass transistors 302 and 304 of bit cell 300 to fully turn off pass transistors 302 and 304. The GWL voltage remains active high until the word line WL is turned off to allow self boosting.

Figure 6:
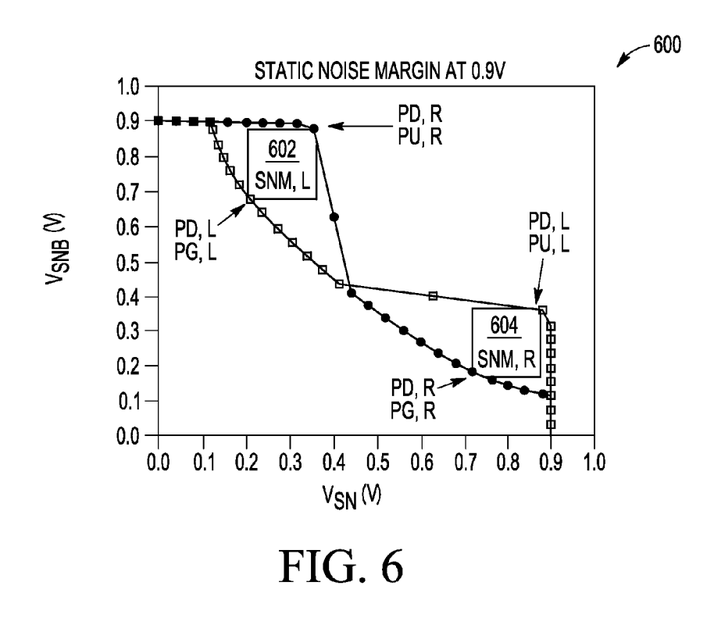
FIG. 6 illustrates an example of a diagram showing static noise margin for the bit cell of FIG. 3.

With reference to FIGS. 3 and 6, FIG. 6 illustrates an example of curves 600 showing static noise margin from a simulation of the bit cell 300 in a PDSOI (Partially Depleted SOI) technology. The x axis is VSN or the voltage on node SN and the y-axis VSNB is the voltage on node SNB, both of bit cell 300. Static noise margin (SNM) is a measure of the stability of the bit cell during the read operation. The size of the openings 602, 604 in the curve is commonly measured as the SNM. Opening 602 corresponds to the left pass transistor 302, the right pull-up PMOS transistor 308 and pull-down NMOS transistor 312 of bit cell 300. Opening 604 corresponds to the right pass transistor 304, the left pull-up PMOS transistor 306 and the left pull-down NMOS transistor 310 of bit cell 300.

For some embodiments of the bit cell 300 of FIG. 3, the low threshold voltage pass transistors 302, 304 have a threshold voltage VT as low as 0 Volts. While the low threshold voltage makes the pass transistors 302, 304 much stronger for write operations, the low threshold voltage degrades the SNM. This occurs because voltage on node SN of FIG. 3 increases during the read operation for a '0' value stored on node SN as the pass transistor 302 becomes stronger. However, bit lines precharged to VDD/2 as used for bit cell 300 weakens the pass transistor 302 and thus helps counter the effect of low threshold voltage of pass transistor 302. The SNM is also improved by pull-up PMOS transistors 306, 308 having approximately the same transconductance as NMOS transistor 310, 312.

Figure 7:
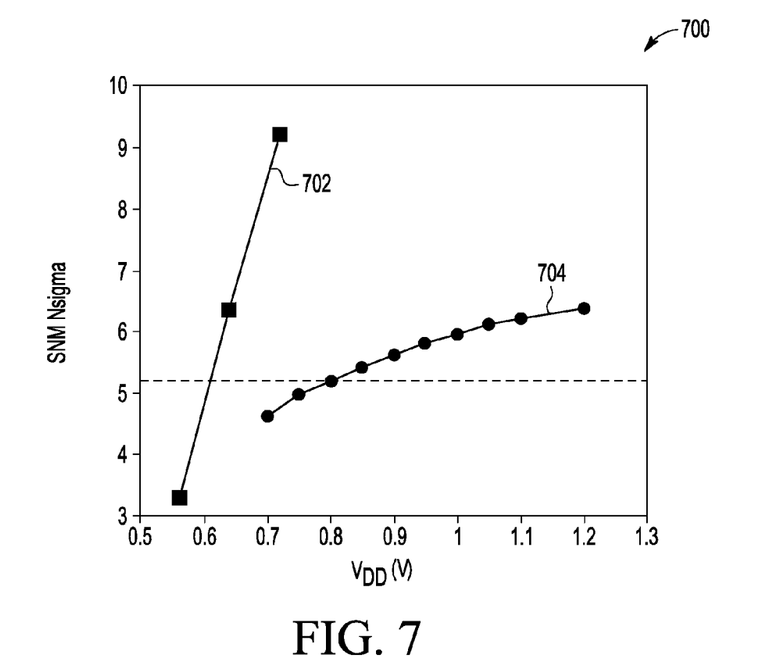
FIG. 7 illustrates an example of static noise margin versus VDD for the bit cell of FIG. 3 compared to known bit cells.

Referring to FIGS. 3 and 7, FIG. 7 illustrates an example of static noise margin versus VDD for bit cell 300 in curve 702 compared to known bit cells in curve 704. The overall impact of bit cell 300 is estimated for FDSOI (Fully Depleted SOI) devices, such as FinFETs. Curve 702 corresponds to pull-up PMOS transistors of comparable strength or transconductance to the pull-down NMOS transistor while the pass transistor threshold voltage VT is approximately 0 Volts and the bit line voltages are set to VDD/2. Curve 704 corresponds to a conventional SRAM cell from a PDSOI technology. The y-axis represents static noise margin (SNM) sigma and is an estimate of the number of sigma's that the SNM is away from 0 assuming normal statistics. The dashed line at Nsigma equals 5.2 corresponds to a minimum level that is needed to provide acceptable yield on large arrays of bit cells. Comparing curve 702 to curve 704, bit cell 300 achieves higher static noise margin while operating at much lower supply voltage VDD than previously known bit cell configurations represented by curve 704.

Figure 8:
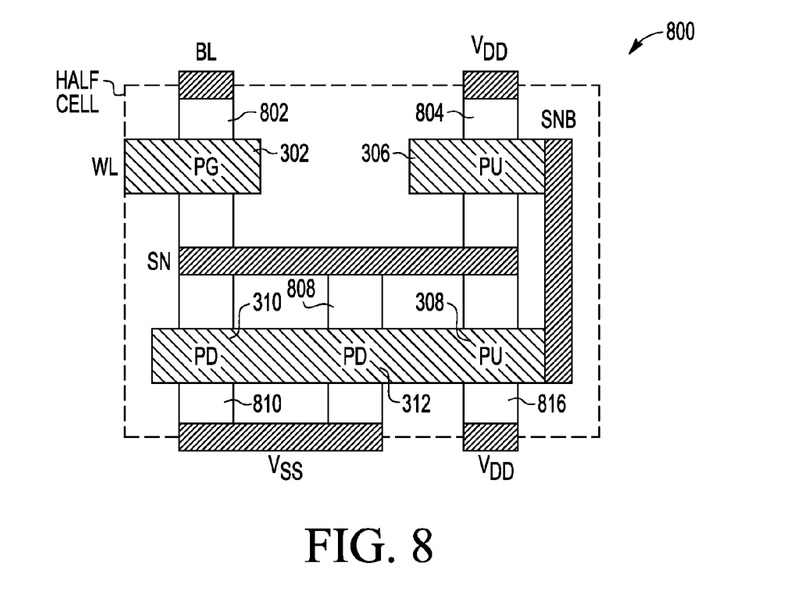
FIG. 8 illustrates an embodiment of a FinFET layout that can be used to implement the bit cell of FIG. 3.

Referring to FIGS. 3 and 8, FIG. 8 illustrates an embodiment of a FinFET layout 800 that can be used to implement one half of bit cell 300 of FIG. 3 including two fins 804, 816 coupled to respective pull-up PMOS transistors 306, 308, two fins 808, 810 coupled to respective pull-down NMOS transistors 310, 312, and one fin 802 coupled to a first low threshold voltage MOSFET that is connected as pass transistor 302. A bit line is coupled to fin 802. Supply voltage VDD is coupled to fin 804 and fin 816. Fins 808, 810 are coupled to ground VSS. Word line signal WL is coupled to pass transistor 302. PMOS transistors 306, 308 are coupled to node SNB. NMOS transistors 310, 312 and fins 804, 806 are coupled to node SN. In some embodiments the low threshold voltage transfer devices may be depletion devices.

By now it should be appreciated that, in some embodiments, there has been provided a memory device comprising a plurality of static random access memory (SRAM) bit cells 300, and a word line driver 402 coupled to provide a word line signal to the bit cells. The word line driver receives a global word line signal that remains active while the word line signal is asserted and subsequently de-asserted, and the word line signal is coupled between a positive supply voltage (VDD) and a supply voltage below ground (VN).

In another aspect, the word line driver can comprise a first latch circuit 409 coupled to a first current electrode of a first pass transistor 408. The first pass transistor includes a control gate coupled to the global word line signal through a second pass transistor. A control gate of the second pass transistor is coupled to the VDD. A second current electrode is connected to a block select bar signal. Capacitance between the control gate and the first and second current electrodes of the first pass transistor couples voltage at the control gate of the first pass transistor to a self-boosted voltage that is greater than the VDD.

In another aspect, the global word line signal may vary only between the VDD and a ground (VSS).

In another aspect, the first pass transistor 408 can output the block select bar signal to the first latch circuit when the global word line signal is asserted.

In another aspect, a block select driver 404 can be coupled to the word line driver. The block select driver includes a second latch circuit 425 configured to receive a word line clock bar signal through a third pass transistor 424, and output a block select bar signal that varies between the VDD and the VN.

In another aspect, the third pass transistor 424 can be coupled to receive a block select signal through a fourth pass transistor 422 at a control gate of the third pass transistor and the word line clock bar signal at a first current electrode of the third pass transistor, and to output the block select bar signal from a second current electrode of the third pass transistor to the word line driver when the block select signal is asserted.

In another aspect, parasitic capacitance between the current electrodes and the control gate of the third pass transistor boosts voltage at the control gate of the third pass transistor to a level above the VDD.

In another aspect, the word line clock bar signal is tri-stated while the word line signal is asserted.

In other embodiments, a static random access memory (SRAM) device can comprise a word line driver coupled to a plurality of SRAM bit cells. The word line driver can be configured to receive a global word line signal that is driven between a positive supply voltage and ground, and a word line clock signal that is driven between a positive supply voltage (VDD) and a ground voltage at one stage of operation and is tristated at another stage of operation. The word line driver can also be configured to output a word line signal that varies from the VDD to a negative voltage that is less than the ground voltage.

In another aspect, a first latch circuit 409 is driven by a signal from a first current electrode of a first pass transistor 408. The first pass transistor includes a control gate coupled to the global word line signal through a second pass transistor, and a second current electrode coupled to a block select bar signal. Capacitance between the control gate and the first and second current electrodes of the first pass transistor couples the voltage at the control gate to a self-boosted voltage that is greater than the VDD while the global word line signal is asserted.

In another aspect, the first pass transistor 408 can output the block select bar signal to the first latch circuit when the first pass transistor is conducting.

In another aspect, a block select driver 404 can be coupled to the word line driver. The block select driver comprises a second latch circuit 425 configured to receive a word line clock bar signal through a third pass transistor, and output a block select bar signal that varies between the VDD and a negative voltage below ground.

In another aspect, the third pass transistor 424 can be coupled to receive a block select signal at a control gate through a fourth pass transistor 422 and the word line clock bar signal at a first current electrode, and to output the block select bar signal through a second current electrode to the word line driver when the block select signal is asserted.

In another aspect, the second and fourth pass transistors are one of a group consisting of: a low threshold voltage device and a depletion device.

In another aspect, the word line clock bar signal is tri-stated while the word line signal is asserted.

In other embodiments, a method for operating a static random access memory (SRAM) memory device can comprise asserting a block select signal in a block select driver, asserting a global word line signal in a word line driver when the block select signal is asserted, and asserting a word line clock bar signal in the block select driver after the block select signal and global word line signals are asserted. The global word line signal can be driven between only a positive supply voltage signal (VDD) and ground and the word line clock signal can be driven between the VDD and the ground during one stage of operation and tristated during another stage of operation. A word line signal can be output to a bit cell. The word line signal varies between the VDD and a negative voltage signal below ground.

In another aspect, the block select signal is received at a control gate of a first pass transistor through a second pass transistor and the word line clock bar signal is received at a first current electrode of the first pass transistor. A block select bar signal is output through a second current electrode of the first pass transistor to a latch circuit. The block select bar signal is latched to generate the word line signal.

In another aspect, the second pass transistor is one of a group consisting of a low threshold voltage device and a depletion device.

In another aspect, the word line clock bar signal is tristated while the word line signal is asserted.

In another aspect, the word line signal varies only between the VDD and the negative voltage signal below ground.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 114, 116 may be located on a same integrated circuit or on a separate integrated circuit or located within another peripheral or slave discretely separate from other elements of system 100. Other modules 118 may also be located on separate integrated circuits or devices. Also for example, system 100 or portions thereof may be soft or code representations of physical circuitry or of logical representations convertible into physical circuitry. As such, system 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device, comprising:
   a plurality of static random access memory (SRAM) bit cells;
   a word line driver coupled to provide a word line signal to the bit cells, wherein
      the word line driver receives a global word line signal that remains active while the word line signal is asserted and subsequently de-asserted, and the word line signal is coupled between a positive supply voltage (VDD) and a supply voltage below ground (VN); and
   a block select driver coupled to the word line driver, wherein the block select driver includes a second latch circuit configured to receive a word line clock bar signal through a third pass transistor, and output a block select bar signal that varies between the VDD and the VN.

2. The device of claim 1, the word line driver comprising:
   a first latch circuit coupled to a first current electrode of a first pass transistor, the first pass transistor includes:
      a control gate coupled to the global word line signal through a second pass transistor, wherein a control gate of the second pass transistor is coupled to the VDD, and
      a second current electrode connected to a block select bar signal, wherein capacitance between the control gate and the first and second current electrodes of the first pass transistor couples voltage at the control gate of the first pass transistor to a self-boosted voltage that is greater than the VDD.

3. The device of claim 2, further comprising:
   the global word line signal varies only between the VDD and a ground (VSS).

4. The device of claim 2, further comprising:
   the first pass transistor outputs the block select bar signal to the first latch circuit when the global word line signal is asserted.

5. The device of claim 1, further comprising:
   the third pass transistor coupled to receive a block select signal through a fourth pass transistor at a control gate of the third pass transistor and the word line clock bar signal at a first current electrode of the third pass transistor, and to output the block select bar signal from a second current electrode of the third pass transistor to the word line driver when the block select signal is asserted.

6. The device of claim 1, wherein parasitic capacitance between the current electrodes and the control gate of the third pass transistor boosts voltage at the control gate of the third pass transistor to a level above the VDD.

7. The device of claim 1, wherein the word line clock bar signal is tri-stated while the word line signal is asserted.

8. A static random access memory (SRAM) device, comprising:
   a word line driver coupled to a plurality of SRAM bit cells, wherein the word line driver is configured to:
      receive a global word line signal that is driven between a positive supply voltage and ground,
      receive a word line clock bar signal that is driven between a positive supply voltage (VDD) and a ground voltage at one stage of operation and is tristated at another stage of operation, and
      output a word line signal that varies from the VDD to a negative voltage that is less than the ground voltage.

9. The device of claim 8, the word line driver further comprising:

a first latch circuit driven by a signal from a first current electrode of a first pass transistor, the first pass transistor includes:
- a control gate coupled to the global word line signal through a second pass transistor, and
- a second current electrode coupled to a block select bar signal, wherein capacitance between the control gate and the first and second current electrodes of the first pass transistor couples the voltage at the control gate to a self-boosted voltage that is greater than the VDD while the global word line signal is asserted.

10. The device of claim 9, further comprising:
the first pass transistor outputs the block select bar signal to the first latch circuit when the first pass transistor is conducting.

11. The device of claim 8, further comprising:
a block select driver coupled to the word line driver, wherein the block select driver comprises a second latch circuit configured to receive a word line clock bar signal through a third pass transistor, and output a block select bar signal that varies between the VDD and a negative voltage below ground.

12. The device of claim 11, further comprising:
the third pass transistor coupled to receive a block select signal at a control gate through a fourth pass transistor and the word line clock bar signal at a first current electrode, and to output the block select bar signal through a second current electrode to the word line driver when the block select signal is asserted.

13. The device of claim 11, wherein the second and fourth pass transistors are one of a group consisting of: a low threshold voltage device and a depletion device.

14. The device of claim 11, wherein the word line clock bar signal is tri-stated while the word line signal is asserted.

15. A method for operating a static random access memory (SRAM) memory device, comprising:
asserting a block select signal in a block select driver;
asserting a global word line signal in a word line driver when the block select signal is asserted;
asserting a word line clock bar signal in the block select driver after the block select signal and global word line signals are asserted, the global word line signal being driven between only a positive supply voltage signal (VDD) and ground, and the word line clock bar signal being driven between the VDD and the ground during one stage of operation and being tristated during another stage of operation; and
outputting a word line signal to a bit cell, the word line signal varies between the VDD and a negative voltage signal below ground.

16. The method of claim 15, further comprising:
receiving the block select signal at a control gate of a first pass transistor through a second pass transistor and the word line clock bar signal at a first current electrode of the first pass transistor and outputting a block select bar signal through a second current electrode of the first pass transistor to a latch circuit; and
latching the block select bar signal to generate the word line signal.

17. The method of claim 16, wherein:
the second pass transistor is one of a group consisting of a low threshold voltage device and a depletion device.

18. The method of claim 15, further comprising:
tristating the word line clock bar signal while the word line signal is asserted.

19. The method of claim 15, wherein the word line signal varies only between the VDD and the negative voltage signal below ground.

* * * * *